(12) United States Patent
Wang et al.

(10) Patent No.: US 7,135,642 B2
(45) Date of Patent: Nov. 14, 2006

(54) INTEGRATED CIRCUIT CARRIER WITH CONDUCTIVE RINGS AND SEMICONDUCTOR DEVICE INTEGRATED WITH THE CARRIER

(75) Inventors: C. F. Wang, Taichung (TW); Chang-Fu Chen, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/946,929

(22) Filed: Sep. 21, 2004

(65) Prior Publication Data

US 2005/0205990 A1 Sep. 22, 2005

(30) Foreign Application Priority Data

Mar. 18, 2004 (TW) ................. 93107235 A

(51) Int. Cl.
*H01R 12/04* (2006.01)
(52) U.S. Cl. ..................................... 174/261
(58) Field of Classification Search ............. 174/260, 174/261, 262, 268, 258; 361/768; 257/784, 257/785, 779
See application file for complete search history.

(56) References Cited

U.S. PATENT DOCUMENTS

| 5,581,122 | A | 12/1996 | Chao et al. |
| 5,686,699 | A | 11/1997 | Chu et al. |
| 5,801,440 | A * | 9/1998 | Chu et al. .................. 257/691 |
| 6,449,169 | B1 | 9/2002 | Ho et al. |
| 6,586,676 | B1 * | 7/2003 | Pritchett et al. ........... 174/52.2 |

* cited by examiner

Primary Examiner—Kmand Cuneo
Assistant Examiner—Yuriy Semenenko
(74) Attorney, Agent, or Firm—Peter F. Corless; Steven M. Jensen; Edwards Angell Palmer & Dodge LLP

(57) ABSTRACT

An integrated circuit carrier with conductive rings and a semiconductor device integrated with the carrier are proposed. A plurality of concave structures are formed on the conductive rings at predetermined positions above which a plurality of wires traverse, the wires being provided for electrically connecting the carrier to a semiconductor chip mounted on the carrier. Therefore, an insulating effect between the wires and the conductive rings is provided to prevent short circuit, so as to maintain the performance of the semiconductor device.

15 Claims, 4 Drawing Sheets

US 7,135,642 B2

INTEGRATED CIRCUIT CARRIER WITH CONDUCTIVE RINGS AND SEMICONDUCTOR DEVICE INTEGRATED WITH THE CARRIER

FIELD OF THE INVENTION

The present invention relates to integrated circuit carriers with conductive rings, and more specifically, to an integrated circuit carrier with a ground ring and a power ring, and a semiconductor device integrated with the carrier.

BACKGROUND OF THE INVENTION

Ball Grid Array (BGA) technology is an advanced type of semiconductor packaging technology, which is characterized by the use of a substrate mounted with a semiconductor chip on a front side thereof and implanted with a grid array of solder balls on a back side thereof, wherein the solder balls serve as input/output (I/O) connections to bond and electrically connect the semiconductor package to an external printed circuit board (PCB). This arrangement allows relatively more I/O connections to be accommodated on the same unit area of a chip carrier such as the substrate to comply with the requirement of a highly integrated semiconductor chip.

In order to make good use of the intended performances of the semiconductor chip in the BGA semiconductor package that is electrically connected to the external PCB via the solder balls, the circuit design of the chip carrier or substrate should be divided for different functions such that power supply, grounding and signal transmission.

U.S. Pat. No. 5,581,122 discloses a substrate provided with conductive rings such as a ground ring and a power ring and signal fingers thereon. Referring to FIG. 1 of a semiconductor device 1, a ground ring 111, a power ring 112 and a plurality of signal fingers 113 are arranged around a chip mounting area 110 on an upper surface of a substrate 11. A semiconductor chip 12 having a plurality of ground pads 121, power pads 122 and signal pads 123 is mounted on the chip mounting area 110. A wire-bonding process is performed to form a plurality of ground wires 131, power wires 132 and signal wires 133. The ground wires 131 electrically connect the ground pads 121 of the chip 12 to the ground ring 111 of the substrate 11; the power wires 132 electrically connect the power pads 122 of the chip 12 to the power ring 112 of the substrate 11; and the signal wires 133 electrically connect the signal pads 123 of the chip 12 to the signal fingers 113 of the substrate 11. Then, an encapsulant (not shown) is formed and encapsulates the upper surface of the substrate. A plurality of solder balls (not shown) are mounted to a lower surface of the substrate and electrically connected to the ground ring 111, the power ring 112 or the signal fingers 113 via corresponding conductive traces (not shown) provided on the lower surface of the substrate. When the semiconductor device 1 is bonded and electrically connected to an external device by the solder balls, the electrical quality of the chip 12 can be sustained via the ground ring 111 and the power ring 112, and the chip 12 can transmit electric charges through the ground ring 111 and is supplied with power through the power ring 112 during operation. Other related prior arts include U.S. Pat. Nos. 5,686,699 and 5,801,440.

Furthermore, along with the development of electronic devices made more compact in size and more complicated in structure, semiconductor package structures have been developed toward a chip size scale. Therefore, how to arrange high-density circuits in gradually reduced space of an integrated circuit carrier becomes am important issue in the associated industry. Accordingly, the integrated circuit carrier is generally designed to shorten a pitch distance between the adjacent conductive rings such as ground ring and power ring and a spaced distance between the conductive rings and the signal fingers, such that surface area of the integrated circuit carrier would be less occupied to thereby provide more area for arranging high-density circuits and facilitate the size miniaturization of the semiconductor device.

Referring to FIG. 2, when the pitch distance between the adjacent conductive rings or the spaced distance between the conductive rings and the signal fingers are reduced to be less than about 200 μm, a solder mask 20 for covering surface circuits of an integrated circuit carrier 2 cannot be precisely applied between the conductive rings 21 due to fabrication limitations, thereby making the area between the conductive rings 21 on the integrated circuit carrier 2 exposed. Then, when a semiconductor chip 22 is mounted on the integrated circuit carrier 2 and electrically connected to the integrated circuit carrier 2 via a plurality of wires 23, the wires 23 connected to the conductive ring 21 located relatively more far from the chip 22 have larger length and loop height and usually traverse above the other conductive ring 21 located closer to the chip 22. These wires 23 may easily sag and come into contact with the exposed underlying conductive ring 21 not covered by the solder mask 20, thereby leading to short circuit between the sagging wires 23 and the contacted conductive ring 21 and affecting reliability of the fabrication processes.

Referring to FIG. 3, in accordance with the foregoing problems, U.S. Pat. No. 6,449,169 discloses a solder mask 30 being applied between adjacent conductive rings 31 such as ground ring and power ring to support any sagging wires 33 and prevent the conductive rings 31 from short circuit. However, as discussed above that due to size miniaturization of the semiconductor device, the pitch distance between the adjacent conductive rings is reduced as much as possible and is not sufficient to accommodate a solder mask. Also the solder mask cannot be reliably provided between the conductive rings due to fabrication limitations, such that the patent is not well practicable in reality.

Therefore, considering the size miniaturization of semiconductor devices, the problem to be solved here is to provide an integrated circuit carrier and a semiconductor device with the carrier, which can prevent wires from short circuit with conductive rings due to undesirable contact between the wires and the conductive rings and provide industrial practicability.

SUMMARY OF THE INVENTION

In light of the prior-art drawbacks, a primary objective of the present invention is to provide an integrated circuit carrier with conductive rings and a semiconductor device integrated with the carrier, which can prevent wires for electrically connecting a semiconductor chip to the carrier from short circuit with the conductive rings of the carrier due to undesirable contact between the wires and the conductive rings.

Another objective of the present invention is to provide an integrated circuit carrier with conductive rings and a semiconductor device integrated with the carrier, so as to reduce surface area on the integrated circuit carrier being occupied by the conductive rings, thereby providing more area for arranging high-density circuits and facilitating the size miniaturization of the semiconductor device.

In accordance with the above and other objectives, the present invention proposes an integrated circuit carrier with conductive rings, comprising one or more conductive rings provided on the integrated circuit carrier and selectively formed with a plurality of concave structures thereon at predetermined positions above which a plurality of wires traverse, the wires being provided for electrically connecting the integrated circuit carrier to an electronic element when being mounted on the integrated circuit carrier.

The present invention also proposes a semiconductor device integrated with the integrated circuit carrier having conductive rings, comprising: the integrated circuit carrier comprising a chip mounting area and a non-chip mounting area, wherein one or more conductive rings and a plurality of electrical connection pads are provided on the non-chip mounting area; and at least one semiconductor chip mounted on the chip mounting area of the integrated circuit carrier, and electrically connected to the one or more conductive rings and the electrical connection pads of the integrated circuit carrier via a plurality of wires; wherein a plurality of concave structures are selectively formed on the one or more conductive rings at predetermined positions above which the wires traverse. The concave structures on the conductive rings can be formed by extension of a solder mask applied on the integrated circuit carrier to partially cover the conductive rings. Alternatively, the concave structures can be formed on the predetermined positions of the conductive rings by a circuit patterning process during fabrication of the integrated circuit carrier.

Therefore, the integrated circuit carrier with conductive rings and the semiconductor device integrated with the carrier proposed in the present invention allow the conductive rings such as a ground ring and a power ring on the carrier to be formed with concave structures at predetermined positions above which wires traverse, the wires being provided for electrically connecting an electronic element such as a semiconductor chip to the carrier. This thus provides an insulation effect or reduces the area of the conductive rings located under tracks of the wires so as to prevent short circuit between the wires and the conductive rings.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
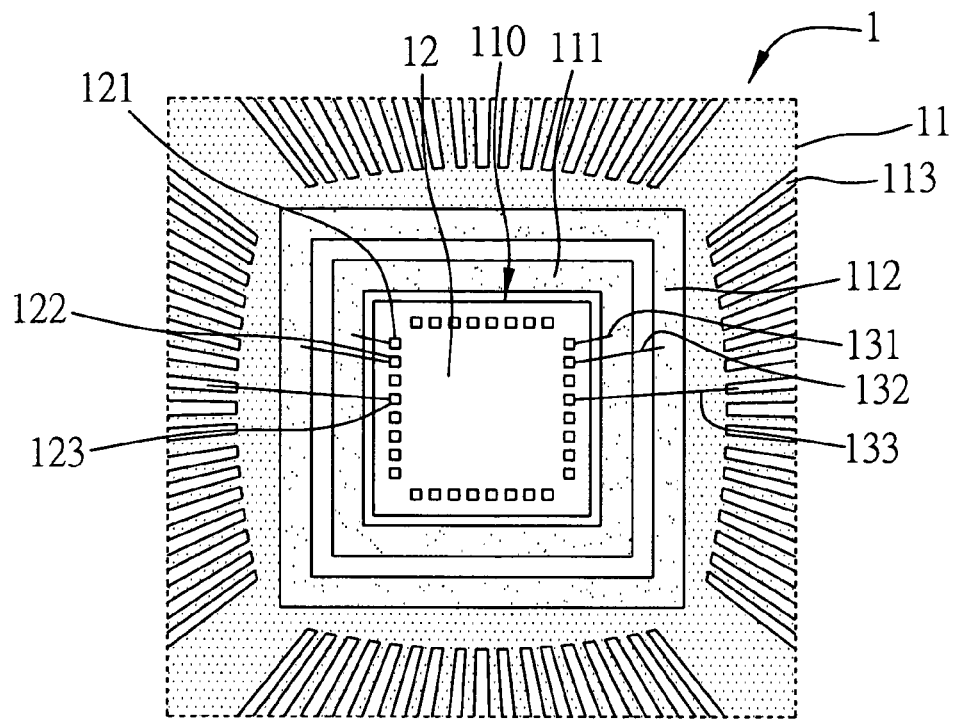
FIG. 1 (PRIOR ART) is a schematic diagram showing a conventional substrate with conductive rings and signal fingers used in a semiconductor device.
Figure 2:
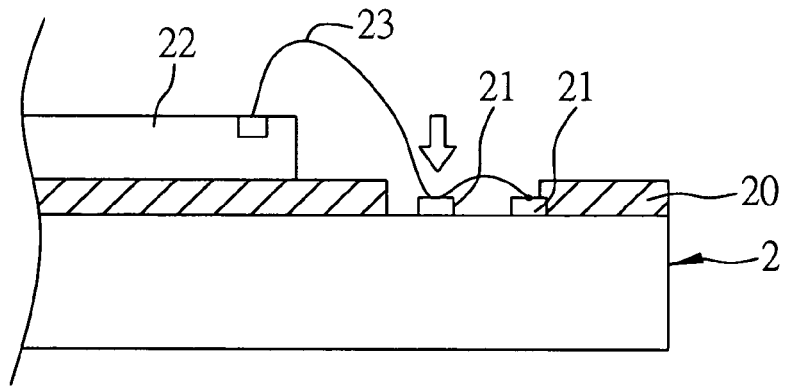
FIG. 2 (PRIOR ART) is a cross-sectional view showing short circuit caused by a wire contacting a conductive ring of a substrate in a conventional semiconductor device.
Figure 3:
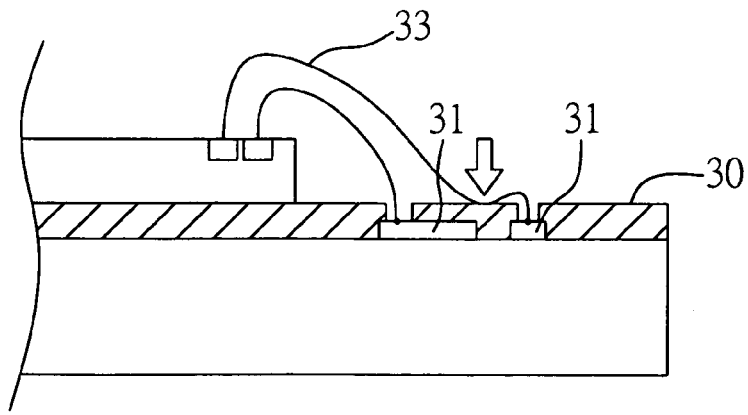
FIG. 3 (PRIOR ART) is a cross-sectional view showing a solder mask being provided between conductive rings to support a sagging wire according to U.S. Pat. No. 6,449,169.
Figure 4:
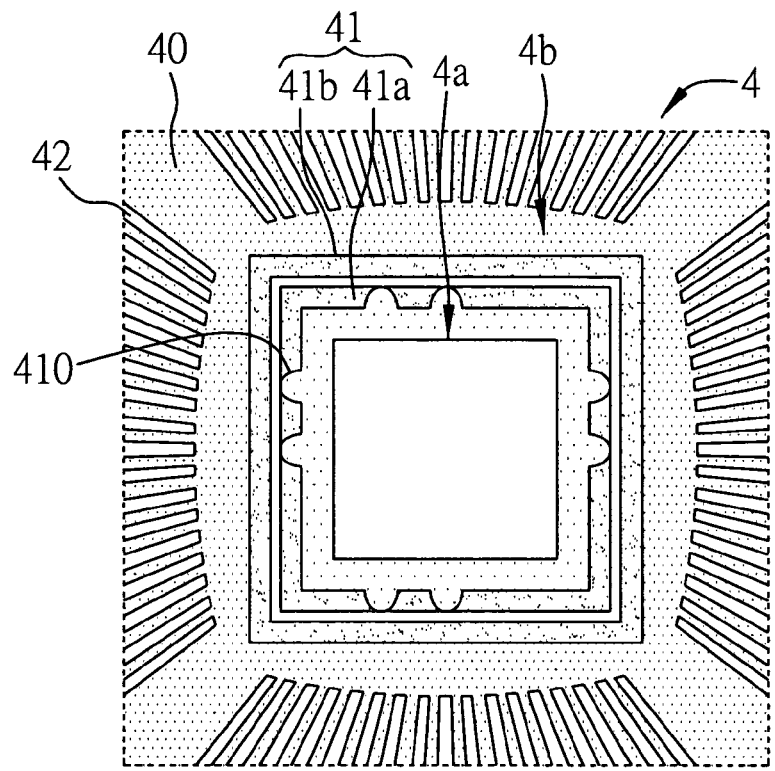
FIG. 4 is a schematic diagram showing an integrated circuit carrier with conductive rings according to the present invention.
Figure 5:
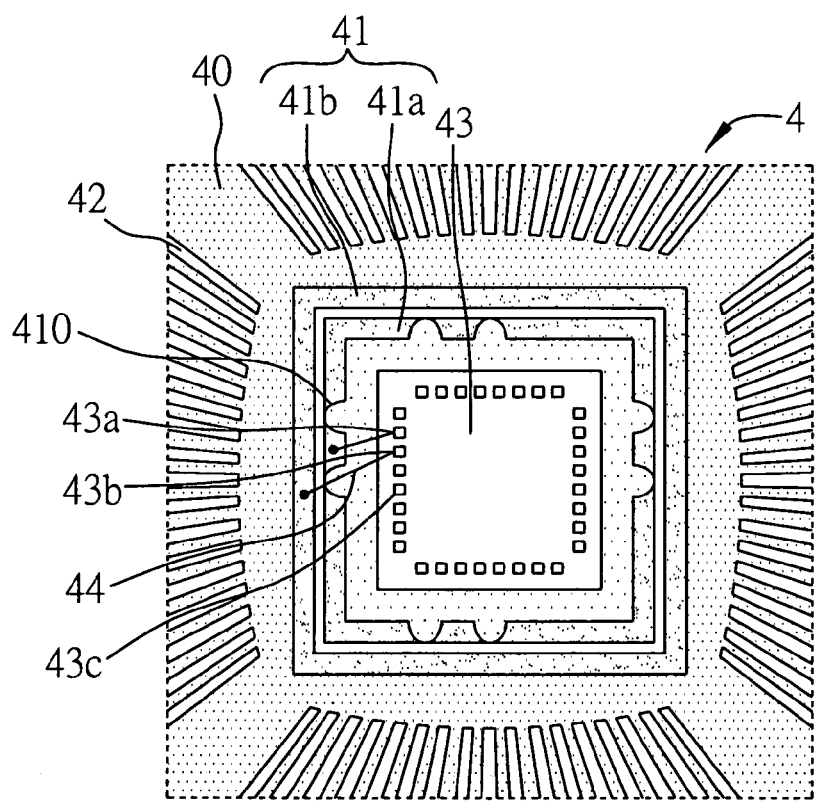
FIG. 5 is a schematic diagram showing a semiconductor device integrated with an integrated circuit carrier with conductive rings according to a preferred embodiment of the present invention.

FIGS. 4 and 5 are schematic diagrams respectively showing an integrated circuit carrier with conductive rings and a semiconductor device integrated with the carrier according to the present invention. It should be understood that the drawings are made in simplicity for easy description of the present invention and only illustrate elements related to the present invention not in actual size. The numbers, shapes and scales of the elements are adjustable in practical application, and a layout of elements for the carrier and semiconductor device is practically more complicated.

The integrated circuit carrier 4 can be a single-layer or multi-layer circuit board and is formed with a patterned insulating layer 40 such as a solder mask thereon for protecting patterned circuits on the integrated circuit carrier 4. The insulating layer 40 has a plurality of openings to expose electrical connection terminals of the integrated circuit carrier 4. The electrical connection terminals provided on an upper surface of the integrated circuit carrier 4 include a plurality of conductive rings 41 and electrical connection pads 42. Moreover, to make the semiconductor device compact in size, a pitch distance between the adjacent conductive rings 41 may be smaller than 200 µm, and the insulating layer 40 is not provided between the conductive rings 41.

A chip mounting area 4a and a non-chip mounting area 4b are formed on the upper surface of the integrated circuit carrier 4. The non-chip mounting area 4b is located around the chip mounting area 4a, and the plurality of conductive rings 41 are provided in the non-chip mounting area 4b, wherein the conductive rings 41 comprise a ground ring 41a and a power ring 41b. The plurality of electrical connection pads 42 such as signal fingers are located around the conductive rings 41 in the non-chip mounting area 4b. It should be noted that, although only a ground ring and a power ring are shown in the drawings, the types and number of the conductive rings can be modified according to practical electrical requirements of the integrated circuit carrier and are not limited to those shown in the drawings.

In a preferred embodiment of the present invention, the conductive rings 41 such as ground ring 41a and power ring 41b located around the chip mounting area 4a substantially have a regular circular shape. The insulating layer 40 located between the chip mounting area 4a and the ground ring 41a is extended to partially cover the ground ring 41a at predetermined positions, such that the ground ring 41a is formed with a plurality of concave structures 410 thereon corresponding to the positions covered by the insulating layer 40.

The chip mounting area 4a of the integrated circuit carrier 4 is ready to be mounted with electronic elements such as a semiconductor chip 43 thereon, wherein a plurality of ground pads 43a, power pads 43b and signal pads 43c are provided on an active surface of the chip 43, and a non-active surface of the chip 43 is attached to the chip mounting area 4a via an adhesive. A plurality of wires 44 are formed to electrically connect the ground pads 43a and the power pads 43b of the chip 43 respectively to the conductive rings 41 such as the ground ring 41a and the power ring 41b of the integrated circuit carrier 4. For the wires 44 that are connected from the power pads 43b to the relatively distal power ring 41b, in order to effectively prevent any of these wires 44 if sagging from short circuit with the ground ring 41a located between the chip 43 and the power ring 41b due to undesirably contact between the sagging wire and the ground ring 41a, the concave structures 410 of the ground ring 41a can be formed at the predetermined positions above which the wires 44 connected to the power ring 41b traverse, so as to provide an insulation effect that if the sagging wire comes into contact with the concave structure 410, it would not cause short circuit with the ground ring 41a.

Figure 6:
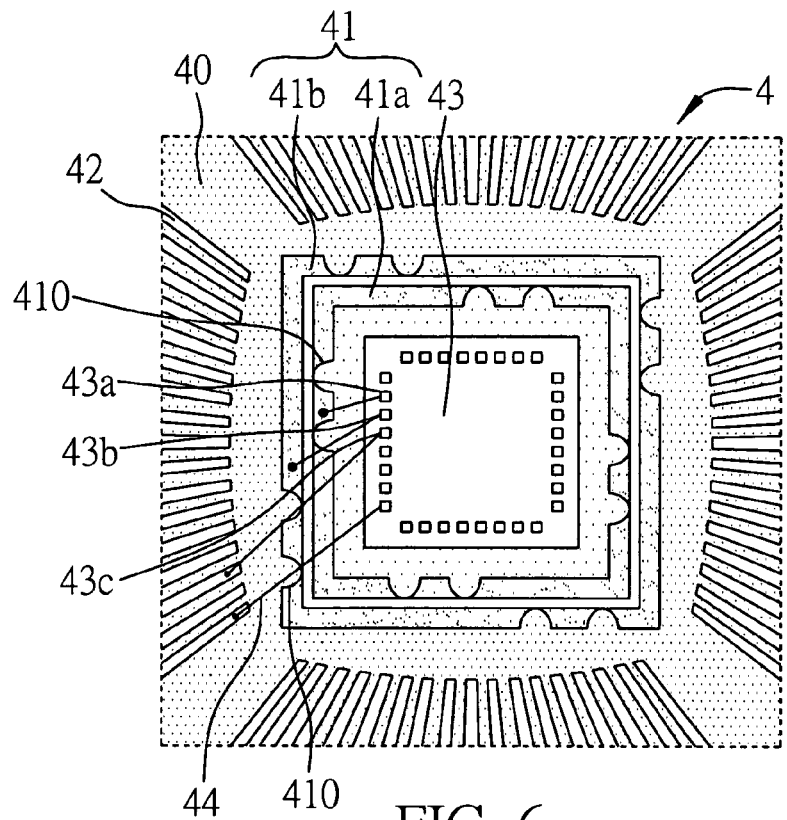
FIG. 6 is a schematic diagram showing a semiconductor device integrated with an integrated circuit carrier with conductive rings according to another preferred embodiment of the present invention.
Figure 7:
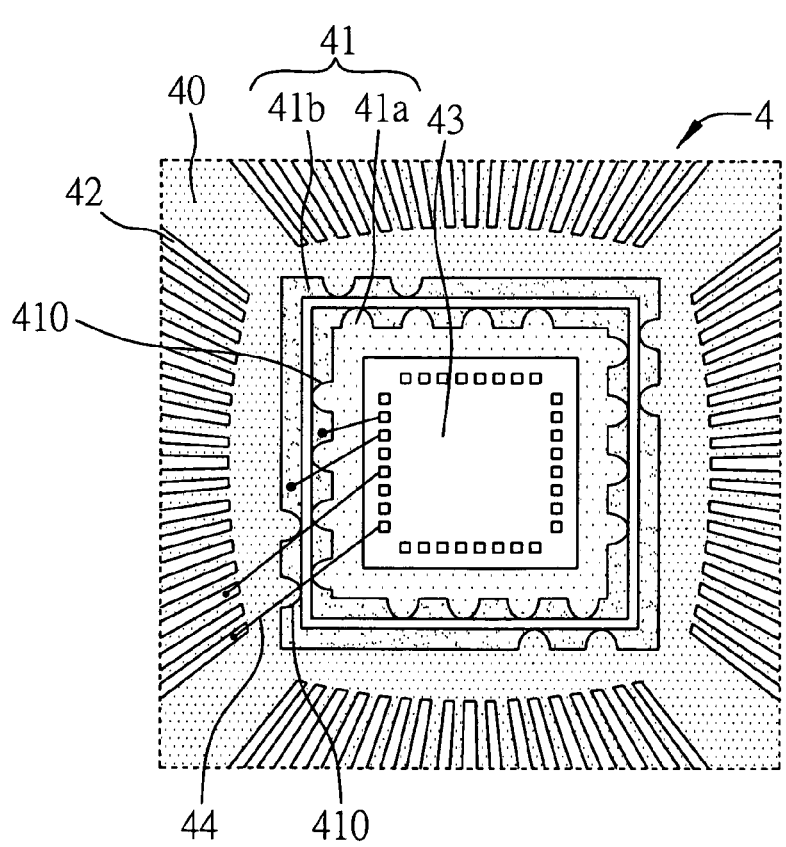
FIG. 7 is a schematic diagram showing a semiconductor device integrated with an integrated circuit carrier with conductive rings according to still another preferred embodiment of the present invention.

Similarly, for the wires 44 that are connected from the signal pads 43c of the chip 43 to the electrical connection pads 42 of the integrated circuit carrier 4, the insulating layer 40 located around the power ring 41b can be extended to partially cover the power ring 41b at predetermined positions located relatively closer to the electrical connection pads 42 and above which the wires 44 traverse so as to form concave structures 410 on the power ring 41b as shown in FIG. 6 and provide the insulation effect. Alternatively, the insulating layer 40 respectively around the ground ring 41a and the power ring 41b can be simultaneously extended to partially cover the ground ring 41a and the power ring 41b and form concave structures 410 both on the ground ring 41a and the power ring 41b (as shown in FIG. 7) so as to provide the insulation effect. As a result, the wires 44 that electrically connect the chip 43 to the electrical connection pads 42 and traverse above the ground ring 41a and the power ring 41b can be prevented from short circuit with the underlying ground ring 41a and/or power ring 41b if any of these wires 44 sags and comes into contact with the concave structure 410 of the ground ring 41a and/or power ring 41b.

After the chip 43 is electrically connected to the integrated circuit carrier 4, an encapsulant (not shown) can be subsequently formed by a molding process to encapsulate the upper surface of the integrated circuit carrier 4, the chip 43 and the wires 44 and protect them against damage from external moisture or contaminants. Solder balls (not shown) can then be mounted to a lower surface of the integrated circuit carrier 4 by a ball implantation process so as to electrically connect the chip 43 to an external device such as printed circuit board.

Therefore, the integrated circuit carrier with conductive rings and the semiconductor device integrated with the carrier proposed in the present invention allow an insulating layer provided on the integrated circuit carrier to be extended to partially cover the conducive rings such as ground ring and power ring so as to selectively form concave structures on the conductive rings at positions above which a plurality of wires traverse, the wires being provided for electrically connecting electronic elements such as a semiconductor chip to the integrated circuit carrier, thereby providing an insulating effect between the wires and the conductive rings above which the wires traverse and preventing short circuit.

Furthermore, in the foregoing embodiments of the present invention, the concave structures are formed by extension of the insulating layer located around the conductive rings to partially cover the conductive rings. Thus, for current electronic devices that are made more compact in size and more complicated in structure, there is no need to apply the insulating layer between the conducive rings, and a pitch distance between the adjacent conductive rings and a spaced distance between the conductive ring and the signal fingers can both be shortened, such that surface area of the integrated circuit carrier would be less occupied, providing more area for arranging high-density circuits and facilitating the size miniaturization of the semiconductor device.

Figure 8:
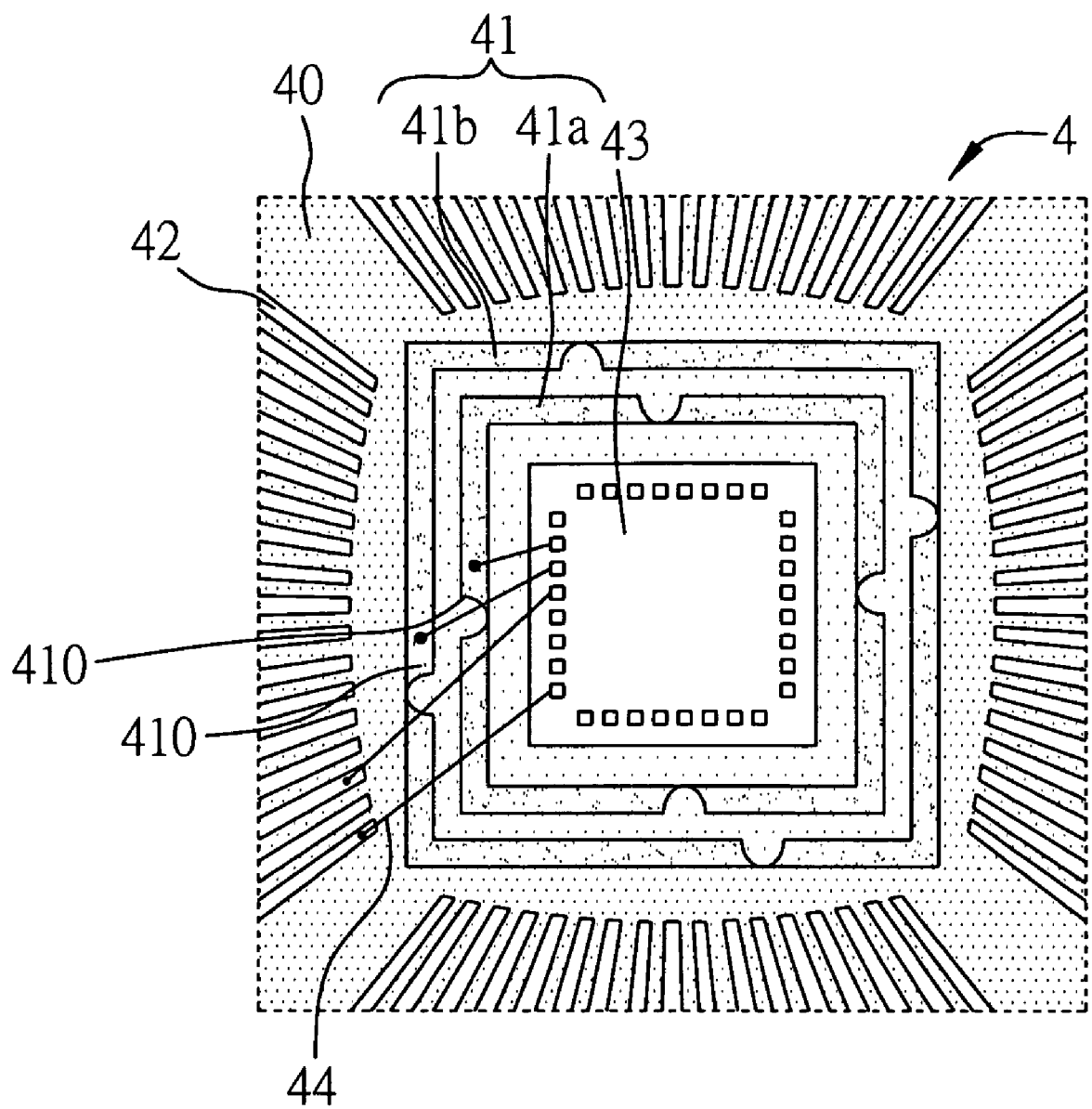
FIG. 8 is a schematic diagram showing a semiconductor device integrated with an integrated circuit carrier with conductive rings according to a further preferred embodiment of the present invention.

Referring to FIG. 8, if there is no particular limitation on the spatial arrangement on the integrated circuit carrier 4 during fabrication, the insulating layer 40 can also be provided between the conductive rings 41 (i.e. between the ground ring 41a and the power ring 41b) and extended to partially cover the conductive rings 41 to form concave structures 410, which can provide an insulation effect and prevent the wires 44 for electrically connecting the chip 43 to the integrated circuit carrier 4 from short circuit with the conductive rings 41.

Moreover, in addition to forming the concave structures on the conductive rings by extension of the insulating layer on the integrated circuit carrier to partially cover the conductive rings, during fabrication of the integrated circuit carrier, the concave structures can also be provided at predetermined positions on the conductive rings by a circuit patterning process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An integrated circuit carrier, comprising one or more conductive rings provided on the integrated circuit carrier and selectively formed with a plurality of concave structures thereon at predetermined positions above which a plurality of wires traverse, the wires being provided for electrically connecting the integrated circuit carrier to an electronic element when being mounted on the integrated circuit carrier, the concave structures being formed by extension of an insulating layer to partially cover the conductive rings at the predetermined positions.

2. The integrated circuit carrier of claim 1, wherein the integrated circuit carrier is a single-layer or multi-layer circuit board.

3. The integrated circuit carrier of claim 1, further comprising a plurality of electrical connection pads provided around the one or more conductive rings.

4. The integrated circuit carrier of claim 1, wherein the one or more conductive rings comprise a ground ring and a power ring.

5. The integrated circuit carrier of claim 1, wherein the insulating layer is a patterned insulating layer formed on the integrated circuit carrier.

6. The integrated circuit carrier of claim 5, wherein the insulating layer extended to partially cover the conductive rings is located around the conductive rings.

7. The integrated circuit carrier of claim 5, wherein the insulating layer extended to partially cover the conductive rings is located between the adjacent conductive rings.

8. The integrated circuit carrier of claim 1, wherein the one or more conductive rings are patterned to form the concave structures at the predetermined positions thereof.

9. A semiconductor device integrated with an integrated circuit carrier, comprising:
- the integrated circuit carrier comprising a chip mounting area and a non-chip mounting area, wherein one or more conductive rings and a plurality of electrical connection pads are provided on the non-chip mounting area; and
- at least one semiconductor chip mounted on the chip mounting area of the integrated circuit carrier, and electrically connected to the one or more conductive rings and the electrical connection pads of the integrated circuit carrier via a plurality of wires;
- wherein a plurality of concave structures are selectively formed on the one or more conductive rings at predetermined positions above which the wires traverse, the concave structures being formed by extension of an insulating layer to partially cover the conductive rings at the predetermined positions.

10. The semiconductor device of claim 9, wherein the integrated circuit carrier is a single-layer or multi-layer circuit board.

11. The semiconductor device of claim 9, wherein the one or more conductive rings comprise a ground ring and a power ring.

12. The semiconductor device of claim 9, wherein the insulating layer is a patterned insulating layer formed on the integrated circuit carrier.

13. The semiconductor device of claim 12, wherein the insulating layer extended to partially cover the conductive rings is located around the conductive rings.

14. The semiconductor device of claim 12, wherein the insulating layer extended to partially cover the conductive rings is located between the adjacent conductive rings.

15. The semiconductor device of claim 9, wherein the one or more conductive rings are patterned to form the concave structures at the predetermined positions thereof.

* * * * *